ID [19] United States Patent
Kauffmann et al.

[11] Patent Number: 5,291,439
[45] Date of Patent: Mar. 1, 1994

[54] SEMICONDUCTOR MEMORY CELL AND MEMORY ARRAY WITH INVERSION LAYER

[75] Inventors: Bruce A. Kauffmann, Jericho; Chung H. Lam, Williston; Jerome B. Lasky, Essex Junction, all of Vt.

[73] Assignee: International Business Machines Corporation, Armonk, N.Y.

[21] Appl. No.: 758,656

[22] Filed: Sep. 12, 1991

[51] Int. Cl.$^5$ ............................................. G11C 11/40
[52] U.S. Cl. ..................................... 365/185; 257/315; 257/321
[58] Field of Search ............... 365/185; 257/313, 316, 257/317, 318, 319, 320, 324, 315

[56] References Cited

U.S. PATENT DOCUMENTS

| | | | |
|---|---|---|---|
| 4,099,196 | 7/1978 | Simko | 357/23 |
| 4,122,543 | 10/1978 | Bert et al. | 257/326 |
| 4,274,012 | 6/1981 | Simko | 307/238.3 |
| 4,328,565 | 5/1982 | Harari | 365/185 |
| 4,343,657 | 8/1982 | Ito et al. | 257/313 |
| 4,375,086 | 2/1983 | Van Velthoven | 257/316 |
| 4,380,863 | 4/1983 | Rao | 29/571 |
| 4,462,090 | 7/1984 | Iizuka | 257/316 |
| 4,486,769 | 12/1984 | Simko | 357/41 |
| 4,498,095 | 2/1985 | Garbarino et al. | 257/313 |
| 4,527,256 | 7/1985 | Giebel | 365/230.03 |
| 4,665,417 | 5/1987 | Lam | 357/23.5 |
| 4,729,115 | 3/1988 | Kauffmann et al. | 365/185 |
| 4,803,529 | 2/1989 | Masuoka | 357/23.5 |
| 4,967,393 | 10/1990 | Yokoyama et al. | 365/185 |
| 4,979,146 | 12/1990 | Yokoyama et al. | 365/185 |
| 4,982,377 | 1/1991 | Iwasa | 365/185 |
| 4,989,054 | 1/1991 | Arima et al. | 357/23.5 |
| 5,021,848 | 6/1991 | Chiu | 365/185 |

FOREIGN PATENT DOCUMENTS

| | | |
|---|---|---|
| 0349774 | 1/1990 | European Pat. Off. |
| 0388060 | 9/1990 | European Pat. Off. |
| 59-967A | 1/1984 | Japan |
| 62-266793 | 11/1987 | Japan |
| 0143361 | 6/1989 | Japan ............... 365/185 |
| 1-181573 | 7/1989 | Japan |
| 2107519 | 4/1983 | United Kingdom |

OTHER PUBLICATIONS

Gill et al., A 5-Volt Contactless Array 256KBIT Flash EEPROM Technology, IEEE, pp. 428-431, 1988.

Primary Examiner—Eugene R. LaRoche
Assistant Examiner—Vu A. Le
Attorney, Agent, or Firm—Heslin & Rothenberg

[57] ABSTRACT

A memory cell, suitable for electrically erasable programmable read only memories (EEPROMs), includes direct write cell capability. The memory cell is fabricated on a substrate and uses an inversion source gate disposed above the substrate to generate a depletion source therein. The depletion source defines a channel region in the substrate with an associated drain. An electrically isolated floating gate is disposed above the substrate so as to overlap at least a portion of the substrate channel region. Further, a program gate is disposed to overlap a portion of the floating gate and an access gate is also provided aligned at least partially over the substrate channel region such that a dual gate device is defined. An array of such memory cells can also be constructed.

24 Claims, 7 Drawing Sheets

SEMICONDUCTOR MEMORY CELL AND MEMORY ARRAY WITH INVERSION LAYER

BACKGROUND OF THE INVENTION

1. Technical Field

The present invention relates in general to semiconductor memory devices suitable for electrically erasable programmable read only memories (EEPROMs), and more particularly, is directed to MOS floating gate memory cells and memory arrays comprising dense contactless structures with direct write cell capabilities.

2. Description of the Prior Art

Non-volatile floating gate MOS memories are well known in the industry. In such devices, the conductive state of the transistor memory cell is determined by the voltage of the associated floating gate. Typically, a negatively charged floating gate is representative of a binary one state while an uncharged floating gate is representative of a binary zero state.

More particularly, a conventional electrically programmable read only memory (EPROM) utilizes a floating (unconnected) conductive gate, in a field effect transistor structure, positioned over but insulated from a channel region in a semiconductor substrate, between source and drain regions. A control gate is then provided over the floating gate, but also insulated therefrom. The threshold voltage ($V_T$) characteristic of the transistor is controlled by the amount of charge that is retained on the floating gate. That is, the minimum amount of voltage (threshold) that must be applied to the control gate before the transistor is turned "on" to permit conduction between its source and drain regions is controlled by the level of charge on the floating gate. A transistor is programmed to one of two states by accelerating electrons from the substrate channel region, through a thin gate dielectric and onto the floating gate.

The memory cell transistor's state is read by placing an operating voltage across its source and drain and on its control gate, and then detecting the level of current flowing between the source and drain as to whether the device is programmed to be "on" or "off" at the control gate voltage selected. A specific, single cell in a two-dimensional array of EPROM cells is addressed for reading by application of a source-drain voltage to the source and drain lines in a column containing the cell being addressed, and application of a control gate voltage to the control gates in a row containing the cell being addressed.

One example of such a memory cell is a triple polysilicon, split channel electrically erasable and programmable read only memory (EEPROM). It is termed a "split channel" device since the floating and control gates extend over adjacent portions of the channel. This results in a transistor structure that operates as two transistors in series, one having a varying threshold in response to the charge level on the floating gate, and another that is unaffected by the floating gate charge but rather which operates in response to the voltage on the control gate as in any normal field effect transistor.

Such a memory cell is termed a "triple polysilicon" cell because it contains three conductive layers of polysilicon material. In addition to the floating and control gates, an erase gate is conventionally included. The erase gate passes through each memory cell transistor closely adjacent to a surface of the floating gate but insulated therefrom by a thin tunnel dielectric. Charge is then removed from the floating gate of the cell to the erase gate, when appropriate voltages are applied to all the transistor elements. An array of EEPROM cells are generally referred to as a "Flash" EEPROM array if an entire array of cells, or a significant group of cells, is erased simultaneously (i.e., in a flash).

Conventionally, to write data into a memory cell, the cell must be first erased and then written. Each of these operations takes approximately ten milliseconds, and each requires, for example, a 20 V supply of voltage. Decoder circuits are used to sustain the needed high voltages at the appropriate cells. These high voltage circuits generally do not scale down in size with the decreasing line widths now attainable with ever improving lithographic techniques. (By comparison, to read a device typically requires three to five volts applied and read cycle times are on the order of hundreds of nanoseconds.) Further, the required step of erasing the floating gate prior to writing data for storage thereon obviously adversely effects the operational speed of a semiconductor array of these type memories.

SUMMARY OF THE INVENTION

Briefly summarized, the present invention comprises in one embodiment a memory cell fabricated on a substrate. The cell includes a drain and an inversion source gate. The inversion source gate is disposed above an upper surface of the substrate such that an inversion source is induced in the substrate bene the gate when a potential is applied thereto. A channel region is defined in the substrate between the drain and the depletion source. An electrically isolated floating gate, also disposed above the upper surface of the substrate, is located so as to partially overlap the inversion source gate and is electrically isolated therefrom. The floating gate is further aligned at least partially over the substrate channel region. A program gate is also disposed above the upper surface of the substrate and is electrically isolated from the substrate, the inversion source gate and the floating gate. The program gate is located so as to overlap at least a portion of the floating gate. Lastly, an access gate is disposed above the upper surface of the substrate and is electrically isolated from the substrate, inversion source gate, floating gate and program gate. The access gate is directly aligned at least partially over the substrate channel region.

In operation, application of an appropriate potential to the inversion source gate and simultaneous application of a potential to the access gate establishes a cell read cycle to pass charge from the inversion source to the drain. Conversely, application of ground potential to the inversion source gate and simultaneous application of potential to the program gate establishes a cell write cycle to selectively charge the floating gate positively or negatively by respectively grounding or applying voltage to the drain. Additional cell characteristics are also described and claimed herein. For example, in one preferred embodiment, the drain includes an inversion drain gate disposed above the upper surface of the substrate such that a depletion drain is induced in the substrate when a potential is applied thereto.

In another aspect, a memory array fabricated on a substrate is presented. The array includes a plurality of drain lines and a plurality of gate regions. Each gate region is disposed above the substrate adjacent one of the plurality of drain lines and each region includes a floating gate. A plurality of injection source gates are also provided, each of which is disposed above the substrate adjacent to at least one of the plurality of gate regions. Each injection source gate induces an inversion source line in the substrate upon application of an appropriate potential thereto. The inversion source line defines a channel region in the substrate extending to an associated one of the plurality of drain lines. Each defined channel region is at least partially disposed under the associated floating gate. During a read cycle, inversion source lines are established to pass charge through selected ones of the gate regions to their associated drain lines, while during a write cycle inversion source lines are removed to inject charge from selected inversion source gates into the floating gates of adjacent gate regions.

The present invention comprises a dense, contactless memory cell having direct write operation such that the conventional block/chip erase operation is eliminated. Further, high voltage decode circuitry for each word line in a memory array is eliminated thereby enhancing memory array density. The contactless design disclosed also serves to minimize cell area. In addition, when in an array structure, blocks of memory cells can be "flash" written, thereby enhancing operational speed. In one embodiment, the invention is implemented in a diffusionless and isolationless design which minimizes generation/recombination centers in the substrate.

BRIEF DESCRIPTION OF THE DRAWINGS

These and other objects, advantages and features of the present invention will be more readily understood from the following detailed description of certain preferred embodiments of the present invention, when considered in conjunction with the accompanying drawings in which.

DETAILED DESCRIPTION OF THE INVENTION

Figure 1A:
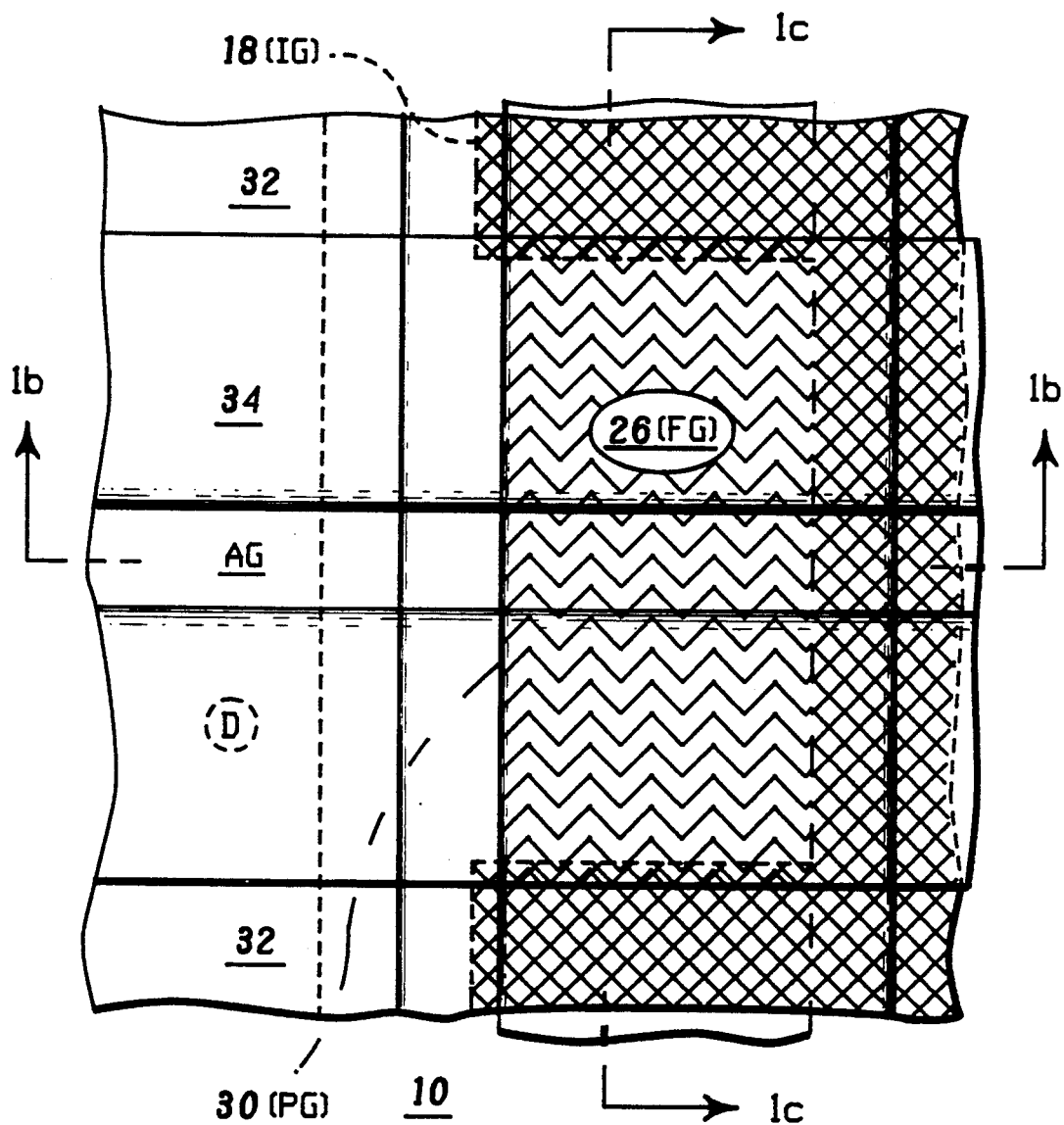
FIG. 1a is a plan view of one embodiment of a memory cell pursuant to the present invention.
Figure 1B:
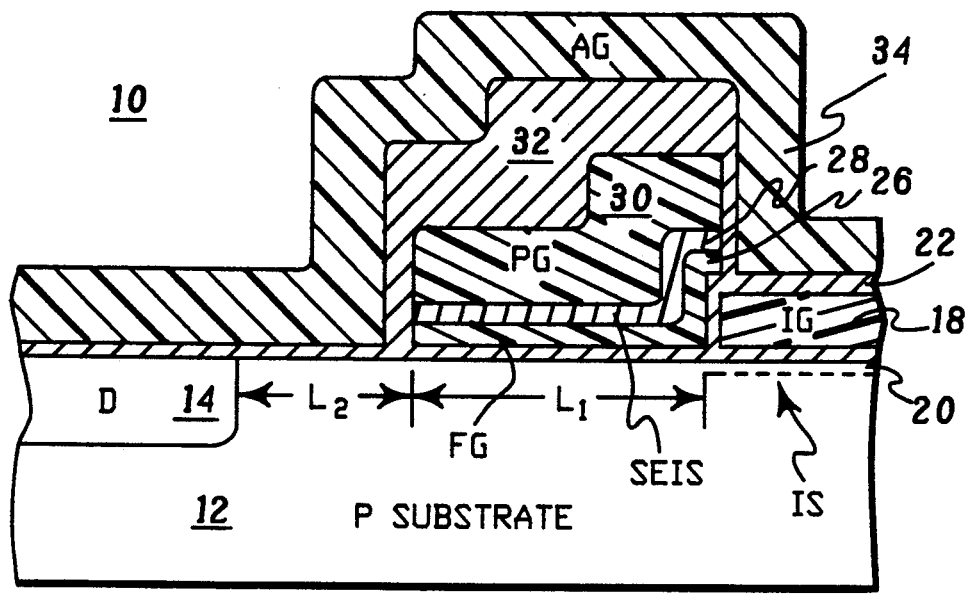
FIG. 1b is a cross-sectional view of the memory cell embodiment of FIG. 1a taken along line 1b-1b.
Figure 1C:
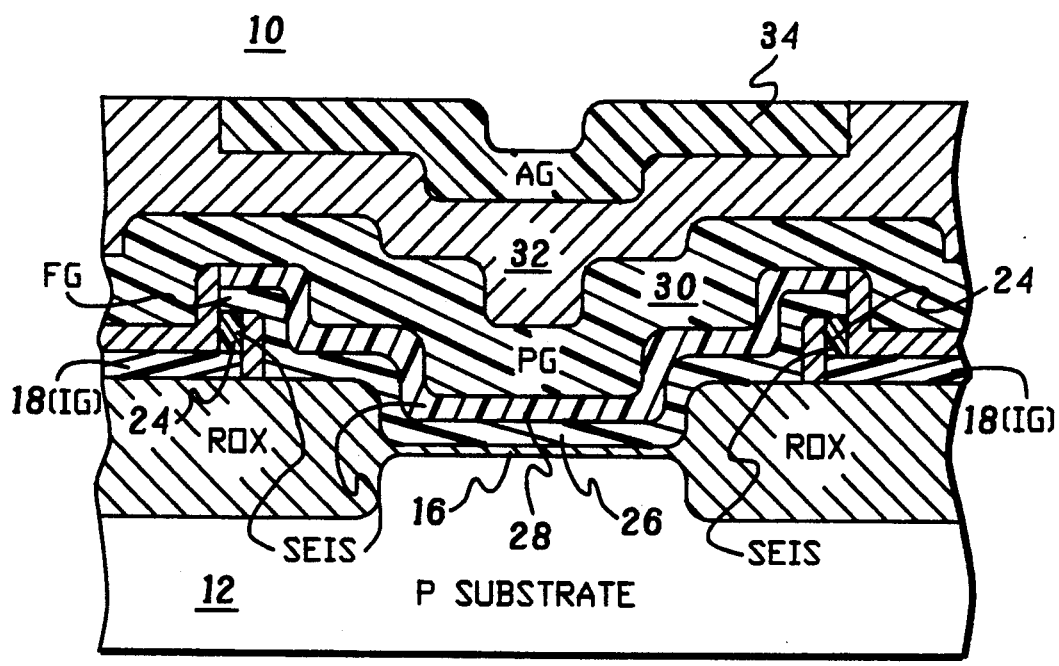
FIG. 1c is a cross-sectional view of the memory cell embodiment of FIG. 1a taken along line 1c-1c.

One embodiment of a memory cell, generally denoted 10, pursuant to the present invention is shown in FIGS. 1a-1c. The depicted embodiment comprises an NMOS device, which is described herein by way of example. A P-type substrate 12 has an N+-type diffusion 14 formed therein by typical ion implantation techniques. Substrate 12 could be fabricated of P-type silicon. Those skilled in the art will recognize that memory cell 10 constitutes a floating gate MOSFET device in series with an access MOSFET device. N+-type region 14 is a diffused bit line which forms the drain (D) of the access device.

Substrate 12 is covered by an oxide layer 16 which is thinly formed in a central region of the cell (see FIG. 1c). A semi-recessed isolation region (ROX) is also grown during this step, using typical techniques. A first polycrystalline silicon layer 18 is then formed on insulating layer 16. In this embodiment, first polycrystalline silicon layer 18 comprises an inversion gate layer (IG) which forms in substrate 12 an inversion source (IS) 20 (FIG. 1b) for the floating gate device when a potential is applied thereto, an N-type, inversion source (20) is formed in P-type substrate 12 when a potential is applied to gate layer 18. Thus, a channel is formed in the P-type substrate between the diffused drain and the inversion when one or both of the gates of the split gate structure are activated. The inversion gate (IG) is covered by an oxide layer 22 which is patterned with a layer of single electron injector structure (SEIS) material 24 (FIG. 1c) over selected portions of gate 18. Oxide layer 22 and SEIS material 24 are then covered by a second polycrystalline silicon layer 26 which is etched to form a floating gate (FG). Another SEIS layer 28 is then formed on top of floating gate 26 using conventional techniques. SEIS layer 28 is only formed on the upper surface of floating gate 26; the sides of the floating gate are oxidized to form conventional oxide layers.

A third layer 30 of polycrystalline silicon is deposited to cover the upper surface of SEIS material 28. Layer 30 comprises a program gate (PG) or control gate electrode which preferably overlies all of the floating gate (FG). A further oxide layer 32 is formed to cover program gate layer 30, after which a forth layer 34 of polycrystalline silicon is deposited. Layer 34 forms the access gate (AG) of the word line device. As shown best in FIG. 1b, cell 10 comprises a split gate device wherein the channel defined between diffused drain 14 and inversion source 20 is controlled for a length $L_1$ by charge on the floating gate 26 and by the access gate (AG) for a length $L_2$, which is in series with length $L_1$. Access gate (AG) is a low voltage decode which is preferably coupled to allow access to an entire word line in a memory array configuration (discussed below).

Note that cell 10 can directly overwrite previously stored data on the floating gate without an intervening erase cycle, which is a significant advantage since the conventional erase operation is time consuming and requires high voltage decode circuitry. Direct overwriting is accomplished pursuant to the present invention by providing the floating gate (FG) with two different areas of electron injection. A first area of electron injection is provided by the program gate (PG) disposed above the floating gate and the second area by the inversion gate (IG) located below and adjacent the periphery of the floating gate. Both areas include a layer of single electron injector structure (SEIS) material which is disposed to facilitate electron injection from the bottom electrode to the top electrode, i.e., from the inversion gate (IG) to the floating gate (FG) or from the floating gate (FG) to the program gate (PG). The size difference between the floating gate (FG) to inversion gate (IG) interface and the program gate (PG) to floating gate (FG) interface effects the capacitance of the respective control gates, which is next discussed in more detail below in connection with the write operation of cell 10.

Initially, the program gate voltage ($V_{PG}$) and the access gate voltage ($V_{AG}$) are grounded (0 V) and the inversion gate potential ($V_{IG}$) is set to the chip power supply voltage ($V_{DD}$) (e.g., 3.3 V). The voltage at the inversion source ($V_{IS}$) of the floating gate device is charged to $V_{DD}-V_T$, where $V_T$ is the threshold voltage of the MOS structure. Under these conditions, the floating gate channel $L_1$ in substrate 12 is depleted of electrons. Programming of the floating gate begins by grounding the inversion gate (IG), thus isolating the floating gate channel, after which the program gate voltage ($V_{PG}$) is charged, for example, to 20 volts. With the floating gate channel isolated and depleted of mobile charge, the coupling ratio of the floating gate (FG) due to the program gate (PG) is given by equation (1).

$$\chi_1 = \frac{C_{FP}}{C_{FP} + C_{FI} + \frac{C_{FN}C_{NS}}{C_{FN} + C_{NS}}} \quad (1)$$

where $C_{FN} > C_{NS}$

Figure 2:
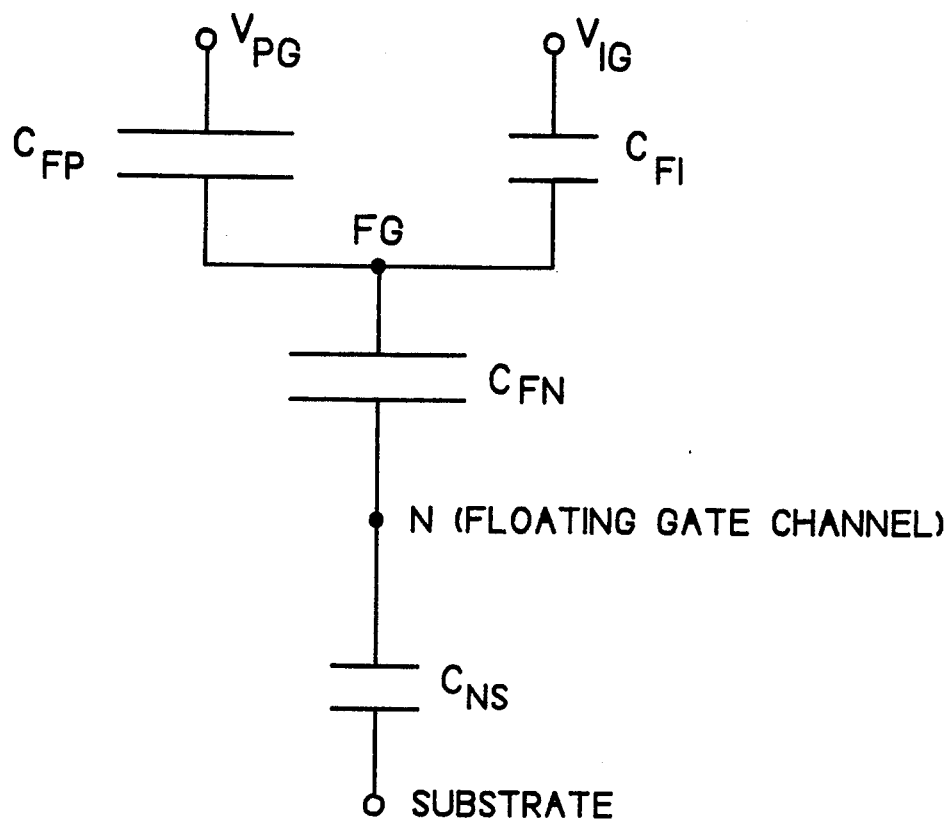
FIG. 2 is an equivalent capacitive circuit for the memory cell embodiment of FIG. 1a-1c.

Parasitic capacitance, which is presumably small, is neglected in equation 1. The corresponding capacitive network for this cell is shown in FIG. 2, where node (N) comprises the surface of the floating gate channel and the substrate node comprises the substrate just below the floating gate channel. The floating gate (FG) is separated from node (N) by thin oxide layer 16 (FIG. 1c) and node (N) is separated from the balance of substrate 12 by the depleted floating gate channel. A practical design value for the coupling ratio $\chi_1$ of the floating gate due to the program gate (PG) is greater than or equal to 0.6 with the capacitance between the floating gate and program gate significantly greater than the capacitance between the floating gate and the inversion gate, and with the capacitance of the floating gate to the program gate greater than or equal to the capacitance of the floating gate to node (N), i.e., the surface of the floating gate channel. Hence the initial floating gate voltage is given to be $\chi_1 V_{PG} \geq V_{PG}/2$.

As a specific example, under the above conditions with the program gate voltage ($V_{PG}$) set to 20 volts, the floating gate is capacitively coupled to the program gate by the coupling ratio $\chi_1$ which if assumed to be 0.6 means that the floating gate voltage ($V_{FG}$) initially equals 12 V. Since program gate voltage ($V_{PG}$) equals 20 V, floating gate voltage ($V_{FG}$) equals 12 V and inversion gate voltage ($V_{IG}$) equals 0 V, electrons will flow from the inversion gate (IG) towards the floating gate (FG) through SEIS material 24 (FIG. 1b) because of the 12 volt difference therebetween. This electron flow negatively charges the floating gate and drops its potential from 12 volts to approximately 10 volts before the electron flow is discontinued.

In writing a '1', the drain (D) is pre-charged to, and the access gate (AG) is pulsed to, the power supply voltage ($V_{DD}$). Since the drain and source of the access device are higher than the device threshold voltage ($V_T$) (floating gate channel being coupled up by the floating gate), the access device is off and the above conditions are unchanged. Electron injection stops when the final floating gate voltage ($V_{FG}$ is approximately equal to $V_{PG}/2$, which accordingly charges the floating gate negatively.

To write a '0', the drain (D) is grounded while the access gate (AG) is pulsed to the power supply voltage ($V_{DD}$). This turns the access device on discharging the floating gate channel to ground and removing the capacitance between the surface node (N) of the substrate and the substrate, i.e., capacitance ($C_{NS}$), thereby altering the coupling ratio of the floating gate (FG) due to the program gate (PG). The altered coupling ratio $\chi_0$ is set forth as equation (2) below.

$$\chi_0 = \frac{C_{FP}}{C_{FP} + C_{FI} + C_{FN}} \quad (2)$$

With the constraints on the capacitor ratio stated above, a practical design value for coupling ratio $\chi_0$ is less than or equal to 0.4. Hence the altered initial floating gate voltage is less than $V_{PG}/2$. Assuming the program gate voltage ($V_{PG}$) equals 20 V, then the initial floating gate voltage ($V_{FG}$) equals 8 V. Again, since the inversion gate voltage ($V_{IG}$) is grounded, there is an 8 volt difference between the floating gate (FG) and the inversion gate (IG), while there is a 12 volt difference between the floating gate (FG) and the program gate (PG). Under this biased condition, electrons are injected from the floating gate (FG) onto the program gate (PG), thus charging the floating gate (FG) positive. Again, electron injection stops when the final floating gate voltage ($V_{FG}$) (i.e., approximately $V_{PG}/2$) is reached.

In practice, equilibrium is typically reached at other than exactly one half $V_{PG}$. This is because the floating gate (FG) and the program gate (PG) interface over a large surface area while the floating gate (FG) and the inversion gate (IG) interface over a small area. In evaluating the resistive network, there is a greater voltage drop between the floating gate and the inversion gate than there is between the floating gate and the program gate so in both cases there will be a slightly higher positive charge than ideally anticipated. For example, instead of reaching equilibrium at exactly 10 volts, it may be reached at 10.8-11 volts. Obviously, surface areas can be adjusted to select an optimum point for design purposes. The particular voltage at which charge transfer stops depends upon the geometry used.

Note that the structure described advantageously requires only the initial setup of conditions for the writing of a zero or a one (i.e., positive or negative charging of the floating gate). There is no need to wait for the cell to reach equilibrium before proceeding to the next memory cell. Further, when assembled in a memory array as discussed below, a block of cells can be accessed sequentially one word line at a time with the program gate (PG) at voltage $V_{PG}$ (e.g., 20 volts) throughout all the access cycles. In this way, conventional high voltage decode circuitry for the writing of each word line is eliminated.

To accomplish a read operation, the program gate (PG) is grounded, the inversion gate (IG) is tied to the power supply voltage ($V_{DD}$) and the access gate (AG) is pulsed to the power supply voltage ($V_{DD}$). In case of a stored '1', the floating gate is negatively charged so no current path exists between the drain (D) and the inversion source (IS), while in the case of a stored '0', the floating gate is positively charged and a current path exists between the drain (D) and the inversion source (IS). The presence or absence of a current path is sensed at the drain (D).

Table 1 summarizes the voltage bias conditions for both read and write operations for a memory cell (or memory array) pursuant to the present invention having the embodiment of FIGS. 1a-1c.

TABLE 1

| | $V_{AG}$ | | $V_D$ | $V_{IS}$ | | $V_{IG}$ | $V_{PG}$ | |
| --- | --- | --- | --- | --- | --- | --- | --- | --- |
| | Sel. Row | Unsel. Rows | All Columns | Sel. Columns | Unsel. Columns | All Columns | Sel. Block | Unsel. Block |
| READ | 3.3 V | 0 V | 3.3 V | 0 V | 3.3 V-$V_t$ | 3.3 V | 0 V | 0 V |
| WRITE | 3.3 V | 0 V | 3.3/0 V | — | — | 0 V | 20 V | 0 V |

Figure 3:
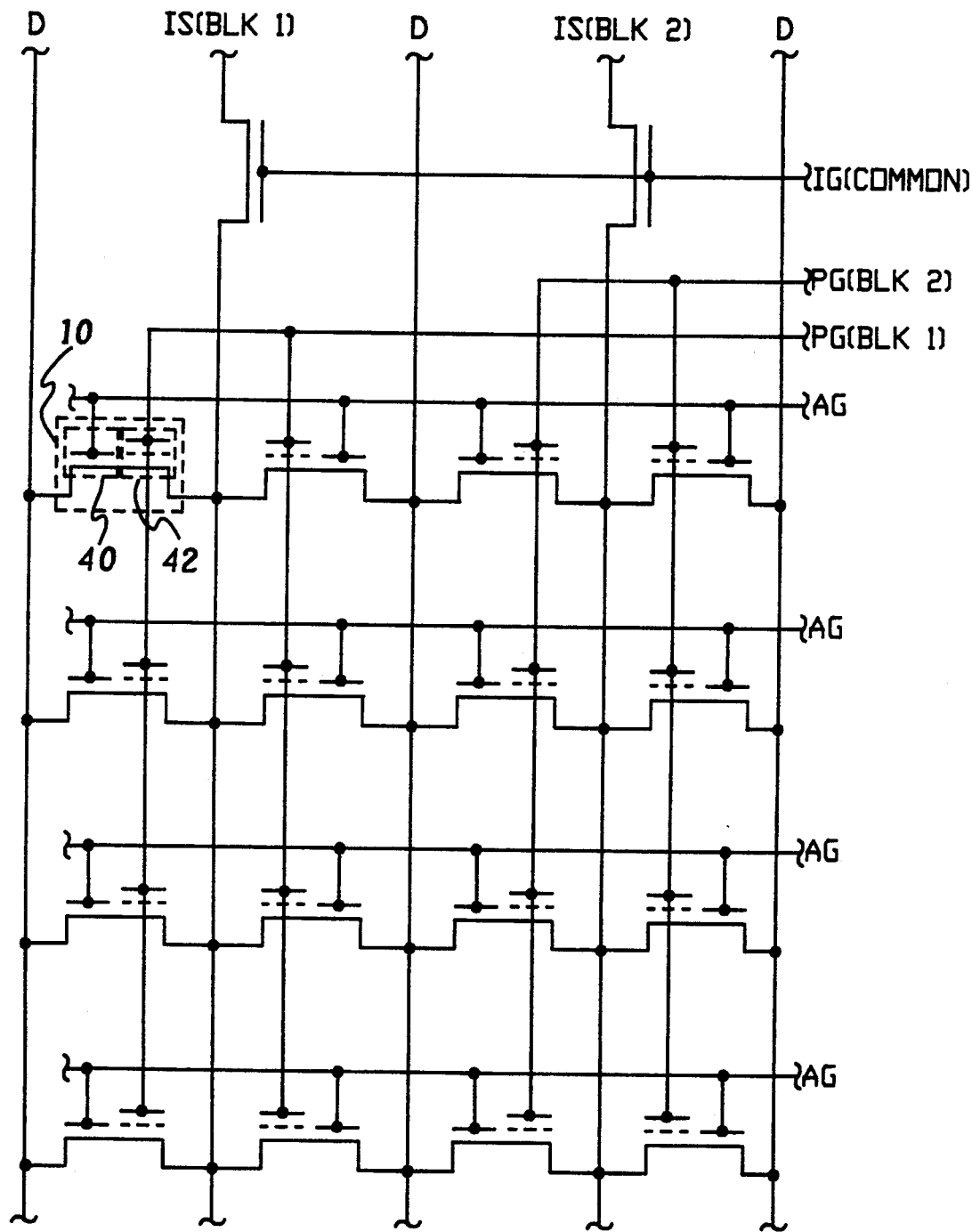
FIG. 3 is a schematic diagram of one embodiment of a memory array having multiple memory cells of the embodiment of FIG. 1a-1c.

A sample schematic of a memory array pursuant to the present invention is depicted in FIG. 3. The circuit shown comprises a four by four array of memory cells 10, each of which includes an access MOSFET device 40 and a floating gate MOSFET device 42. The array is divided into an even number of interlaced blocks (e.g., BLK 1, BLK 2) which need not be physically adjoining. The access gates (AG) of each word line (i.e., horizontal row) are all interconnected. Thus, in this embodiment one half of the memory cells in a single row will be accessed each time a particular row is selected, i.e., assuming only block BLK 1 or BLK 2 has been selected. A particular block is selected by applying 20 volts to the corresponding program gates (PG), which as noted above are connected together for a given block. The program gate voltage ($V_{PG}$) of a selected block stays at 20 volts until an entire selected block is accessed during a write cycle. With a memory array as set forth herein, the cells within an entire block can be "flash" written. As shown, adjacent memory cells can share drain lines and source lines resulting in a more compact array.

Figure 4A:
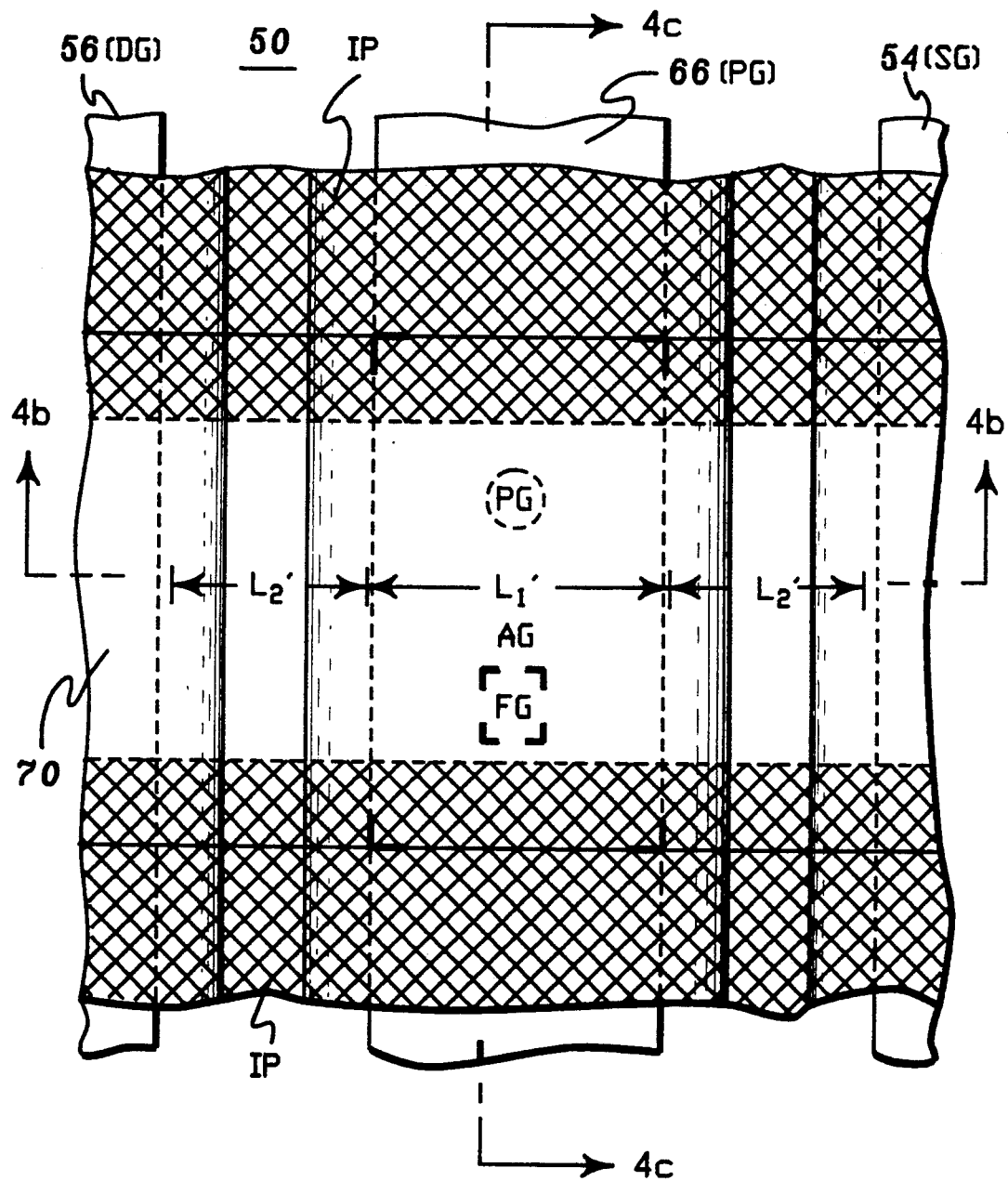
FIG. 4a is a plan view of an alternate embodiment of a memory cell pursuant to the present invention.
Figure 4B:
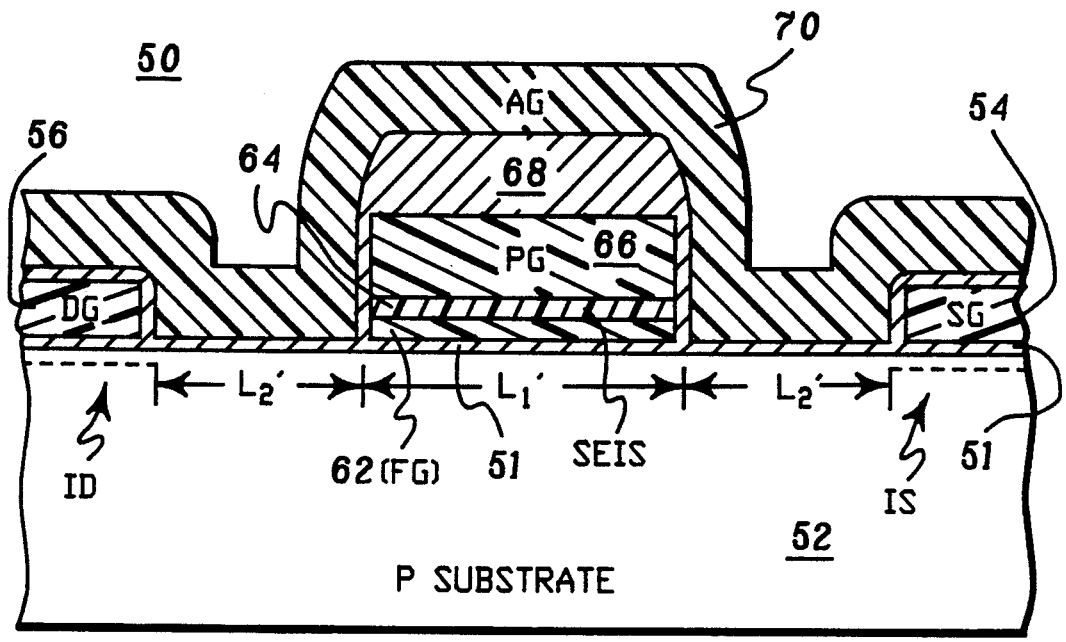
FIG. 4b is a cross-sectional view of the memory cell embodiment of FIG. 4a taken along line 4b-4b.
Figure 4C:
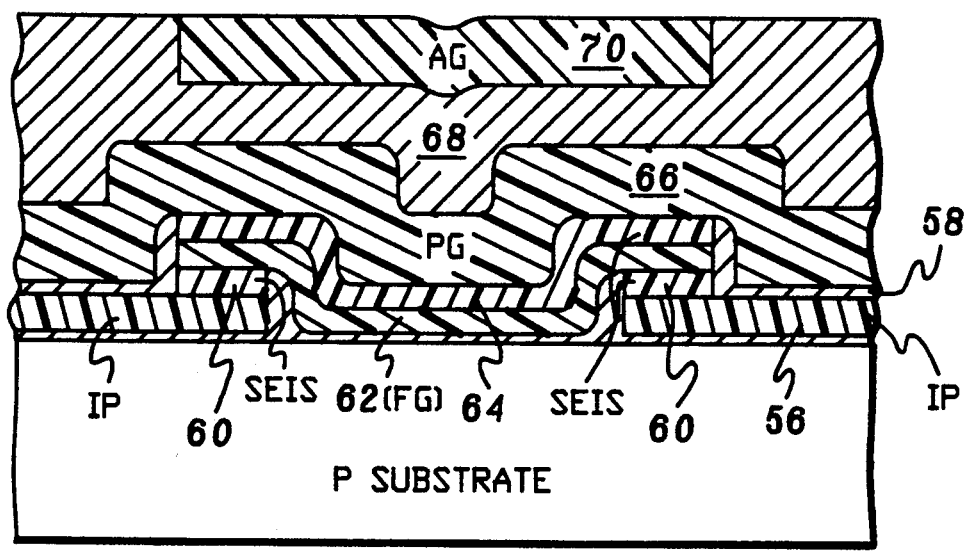
FIG. 4c is a cross-sectional view of the memory cell embodiment of FIG. 4a taken along line 4c-4c.
Figure 5:
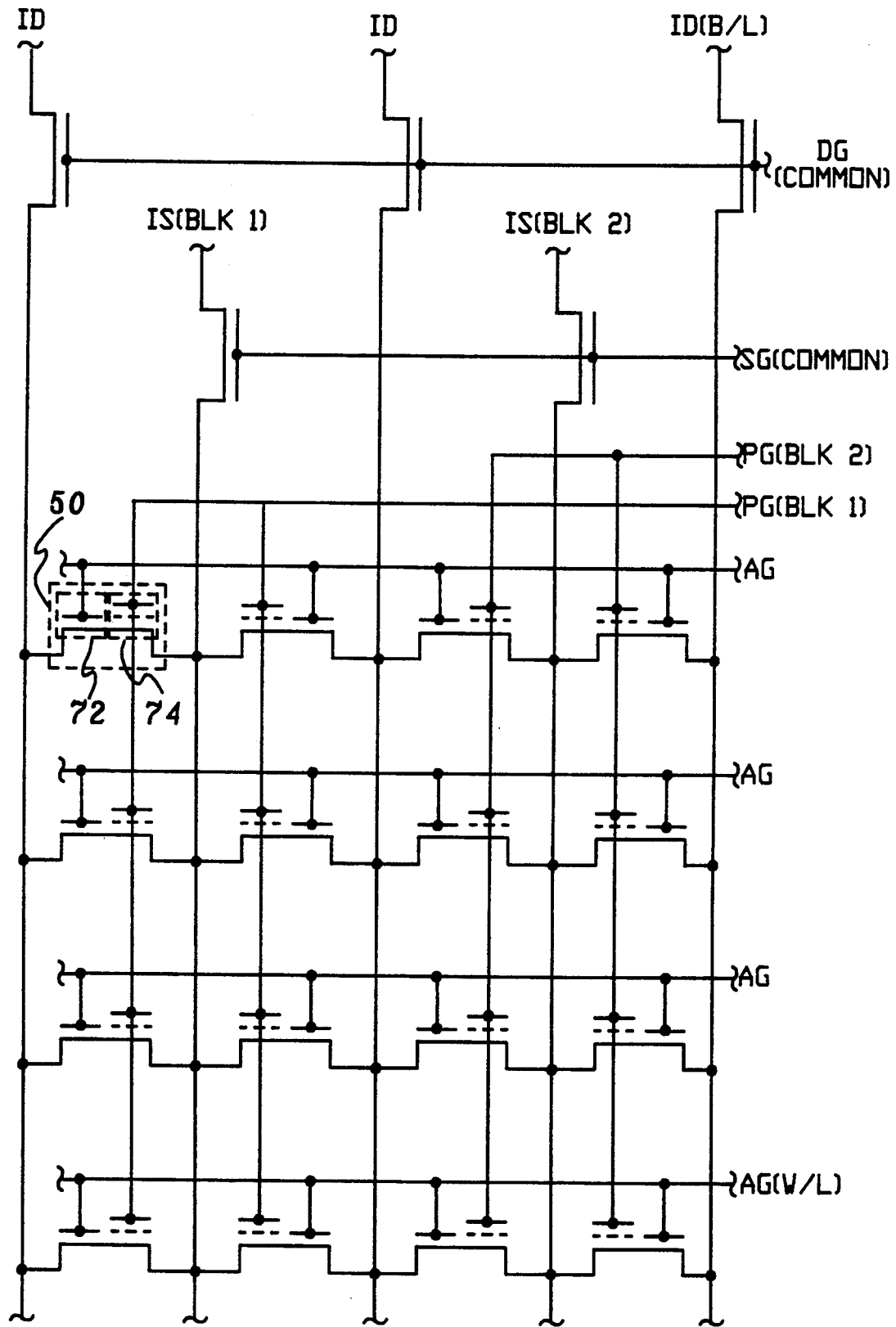
FIG. 5 is a schematic diagram of one embodiment of a memory array having multiple memory cells of the embodiment of FIGS. 4a-4c.

An alternate embodiment of the memory cell device and array depicted in FIGS. 1a-3, is shown in FIGS. 4a-5. The basic structure and concept of operation in both cells is identical except as otherwise noted.

In writing a logical '1' both memory cell embodiments rely on depletion capacitance in a floating gate channel to obtain a high coupling ratio from the program gate (PG) to the floating gate (FG). As memory cell size shrinks with increasingly fine lithography floating gate capacitance ($C_{NS}$) decreases. As such, generation current in the depletion capacitor becomes the governing factor in retaining the depletion capacitor. The depletion capacitor must be maintained throughout the write operation, which can be as long as a millisecond. Dislocations and other defects in the depletion region are generation/recombination centers which will enhance generation current. Trench isolations and diffusions are two main sources of such defects in the silicon. To minimize generation/recombination centers, this embodiment of the invention comprises a pentapolysilicon cell 50 wherein trench isolation and diffusion of the initially described memory cell are eliminated (see FIGS. 4a-4c). More particularly, a thin oxide layer 51 covers a P-type substrate 52. Layer 51 is particularly thin at a central region of the cell where the floating gate stack is to be located. A first polycrystalline silicon layer is formed on insulating layer 51 and patterned for an inversion source gate (SG) 54 and an inversion drain gate 56 (DG). Gates 54 and 56 respectively define an inversion source layer (IS) and an inversion drain layer (ID) in P-type substrate 52 when appropriate potentials are applied thereto.

The inversion gates are covered by additional oxide and a second polycrystalline silicon layer is deposited and patterned to pass over at least partially the first polycrystalline silicon layer definitive of the inversion source gate (SG) and the inversion drain gate (DG). The second polycrystalline silicon layer is itself patterned as an isolation plate (IP) 56 and is disposed such that when maintained at ground potential cell 50 is isolated from adjacent cells (not shown) in an array. The isolation plate (IP) is covered by an oxide layer 58 which is patterned with a layer of single electron injector structure (SEIS) material 60 (FIG. 4c) over selected portions of the isolation plate 56.

Oxide layer 58 and SEIS material 60 are then covered by a third polycrystalline silicon layer 62 which is etched to form a floating gate (FG). Another SEIS layer 64 is formed on top of floating gate 62 using conventional techniques. SEIS layer 64 is only formed on the upper surface of floating gate 62; the sides of the floating gate (FG) are oxidized to form conventional oxide layers. A fourth layer 66 of relatively thick polycrystalline silicon is deposited on the upper surface of SEIS 64. Layer 66 comprises a program gate (PG) electrode which preferably overlies all of the floating gate (FG). A further oxide layer 68 is formed to cover program gate layer 66, after which a fifth layer 70 of polycrystalline silicon is deposited. Layer 70 forms the access gate (AG) of the word line device. As with the previous embodiment, the memory cell of FIGS. 4a-4c comprises a split gate device where the channel defined between the inversion drain and the inversion source is controlled for a central length $L'_1$ by charge on the floating gate 62 and for lengths $L'_2$ by the access gate 70, which as noted in FIG. 4b is directly aligned over the substrate on both sides of the floating gate. As with the prior embodiment, length $L'_1$ is in series with lengths $L'_2$ such that a split gate device is established.

Operationally, cell 50 is analogous to cell 10, the major exception being that the diffused drain has been eliminated in cell 50 and replaced by an inversion drain gate (DG) which, when appropriate potential is applied, establishes an inversion drain (ID) in the substrate. Additionally, the trench isolation regions (ROX) of the previous embodiment are omitted from cell 50. These oxide regions are replaced by an appropriately patterned isolation plate, which in this embodiment is maintained at ground to isolate cell 50 from adjacent cells in a memory array. Thus, the two main sources of dislocations and other defects in the substrate of the cell 10 embodiment (FIG. 1a-1c) are eliminated, thereby reducing the number of generation/recombination centers therein, thus increasing the lifetime of the depletion capacitor induced below the floating gate.

Table 2 depicts the operating voltages on the various electrodes of memory cell 50 during both read and write operations.

TABLE 2

| | $V_{AG}$ | | $V_{DG}$ | $V_{ID}$ | $V_{SG}$ | $V_{IS}$ | | $V_{PG}$ | | $V_{IG}$ |
|---|---|---|---|---|---|---|---|---|---|---|
| | Sel. Row | Unsel. Rows | All Cols. | All Cols. | All Cols. | Sel. Blk. | Unsel. Blk. | Sel. Blk. | Unsel. Blk. | All |
| READ | 3.3 V | 0 V | 3.3 V | 3.3 V-$V_I$ | 3.3 V | 0 V | 3.3 V-$V_I$ | 0 V | 0 V | 0 V |
| WRITE | 3.3 V | 0 V | 3.3 V | Data | 0 V | — | — | 20 v | 0 V | 0 V |

FIG. 5 depicts a sample schematic of a four by four memory array utilizing the memory cell embodiment of FIGS. 4a-4c. Again, each memory cell 50 includes an access MOSFET device 72 and a floating gate MOSFET device 74. The array is similarly divided into an even number of interlaced blocks (e.g., BLK 1, BLK 2) which need not be physically connected. The access gates (AG) of each word line are, however, all interconnected. A particular block is selected by applying 20 volts to the corresponding programs gates (PG), which are also all interconnected for a given block. The program gate voltage ($V_{PG}$) of a selected block stays at 20 volts until an entire selected block is accessed during a write cycle. Thus, with a memory array as set forth, cells within an entire block can be "flash" written. Also as shown, adjacent memory cells can share inversion drains (ID) and inversion sources (IS) resulting in a more compact array.

It will be observed from the above description that the present invention contains the features initially set forth herein. In particular, the described memory cell and memory array comprise dense contactless structures having direct write operations such that a conventional block/chip erase operation is unnecessary. Further, the need for a high voltage decode circuit for each word line in a memory array is eliminated, which advantageously enhances memory array density. When in an array structure, blocks of memory cells can be "flash" written, thereby enhancing operational speed. In a preferred embodiment, the invention is implemented in a diffusionless and isolationless design which minimizes generation/recombination centers in the substrate.

Although specific embodiments of the present invention have been illustrated in the accompanying drawings and described in the foregoing detailed description, it will be understood that the invention is not limited to the particular embodiments described herein, but is capable of numerous rearrangements, modifications, and substitutions without departing from the scope of the invention. The following claims are intended to encompass all such modifications.

What is claimed is:

1. A memory cell fabricated on a substrate, said memory cell comprising:
   a drain;
   an inversion source gate disposed above an upper surface of said substrate such that an inversion is induced in said substrate beneath said inversion source gate when a potential is applied thereto, said inversion and said drain defining a channel region in said substrate;
   an electrically isolated floating gate disposed above the upper surface of said substrate, said floating gate partially overlapping said inversion source gate and being electrically isolated therefrom, said floating gate being aligned at least partially over said channel region in said substrate;
   a program gate disposed above the upper surface of said substrate and being electrically isolated from said substrate, said inversion source gate and said floating gate, said program gate overlapping at least a portion of said floating gate;
   an access gate disposed above the upper surface of said substrate, and being electrically isolated therefrom and from said inversion source gate, said floating gate and said program gate, said access gate being aligned at least partially over said channel region in said substrate; and
   wherein application of a potential to said inversion source gate and simultaneous application of a potential to said access gate establishes a cell read cycle to pass from said inversion to said drain, and wherein application of ground potential to said inversion source gate and simultaneous application of a potential to said program gate establishes a cell write cycle to selectively charge said floating gate positively or negatively by respectively grounding or applying a positive potential to said drain.

2. The memory cell defined by claim 1, wherein said drain is disposed within said substrate and is formed by diffusion.

3. The memory cell defined by claim 1, wherein said inversion source gate is formed as part of a first layer of polysilicon, said floating gate is formed as part of a second layer of polysilicon, said program gate is formed as part of a third layer of polysilicon, and said access gate is formed as part of a fourth layer of polysilicon.

4. The memory cell defined by claim 1, wherein a single electron injector structure material is disposed between said program gate and said floating gate where said program gate overlaps said floating gate, said single electron injector structure material allowing electron flow from said floating gate to said program gate.

5. The memory cell defined by claim 1, wherein a single electron injector structure material is disposed between said floating gate and said inversion source gate where said floating gate overlaps said inversion source gate, said single electron injector structure material allowing electron flow from said inversion source gate to said floating gate.

6. The memory cell defined by claim 1, wherein capacitive coupling between said program gate and said floating gate is substantially greater than capacitive coupling between said floating gate and said inversion source gate.

7. The memory cell defined by claim 1, wherein the capacitive coupling between said program gate and said floating gate is greater than or equal to the capacitive coupling between said floating gate and the upper surface of said substrate.

8. The memory cell defined by claim 1, wherein said drain includes an inversion drain gate disposed above the upper surface of said substrate, said inversion drain gate inducing an inversion drain in said substrate beneath said inversion drain gate when a potential is applied thereto.

9. The memory cell defined by claim 8, further comprising an isolation plate aligned at least partially over said substrate and configured to isolate said cell.

10. The memory cell defined by claim 9, wherein said inversion source gate and said inversion drain gate are formed as part of a first layer of polysilicon, said isolation plate is formed as part of a second layer of polysilicon, said floating gate is formed as part of a third layer of polysilicon, said program gate is formed as part of a fourth layer of polysilicon, and said access gate is formed as part of a fifth layer of polysilicon.

11. The memory cell defined by claim 9, wherein said substrate comprises a P-type substrate and said isolation plate is at ground potential.

12. The memory cell defined by claim 9, wherein said floating gate partially overlaps said isolation plate, and further comprising SEIS material disposed between said floating gate and said isolation plate where said floating gate overlaps said isolation plate, said SEIS material allowing electron flow from said isolation plate to said floating gate.

13. A memory cell having five layers of polysilicon fabricated on a substrate, said memory cell comprising:
   a first polysilicon gate layer comprising an inversion drain gate and a separate inversion source gate, each of said inversion gates being disposed above said substrate such that an inversion drain and an inversion source are respectively produced in said substrate beneath said inversion drain gate and said inversion source gate when potentials are applied thereto, said inversion source and said inversion drain defining a channel region in said substrate;
   a second polysilicon gate layer comprising an insolation plate for isolating said cell, said isolation plate overlying a portion of said substrate and said first polysilicon gate layer;
   a third polysilicon gate layer comprising an electrically isolated floating gate, said third gate layer being isolated from said substrate, said first gate layer and said second gate layer, said third gate layer overlapping at least a portion of said second gate layer and at least a portion of said channel region in said substrate;
   a fourth polysilicon gate layer comprising a program gate, said fourth gate layer being isolated from said substrate, said first gate layer, said second gate layer and said third gate layer, said fourth polysilicon gate layer overlapping at least a portion of said third gate layer;
   a fifth polysilicon gate layer comprising an access gate, said fifth gate layer being isolated from said substrate, said first gate layer, said second gate layer, said third gate layer and said fourth gate layer, said fifth polysilicon gate layer being aligned at least partially over said substrate channel region; and
   wherein application of a potential to said fourth gate layer and simultaneous grounding of said second gate layer establishes a cell write cycle in which said third gate layer may be selectively charged positive or negative by respectively grounding or applying a potential to said inversion drain gate.

14. The memory cell defined by claim 13, wherein said substrate comprises a P-type substrate and said second gate layer is at ground potential.

15. The memory cell defined by claim 13, wherein capacitive coupling between said fourth gate layer and said third gate layer is substantially greater than capacitive coupling between said third gate layer and said first gate layer.

16. The memory cell defined by claim 13, wherein SEIS material is disposed between said fourth gate layer and said third gate layer where said fourth gate layer overlaps said third gate layer, said SEIS material allowing electron flow from said third gate layer to said fourth gate layer.

17. The memory cell defined by claim 13, wherein SEIS material is disposed between said third gate layer and said second gate layer where said third gate layer overlaps said second gate layer, said SEIS material allowing electron flow from said second gate layer to said third gate layer.

18. A memory array fabricated on a substrate, said array comprising:
   a plurality of drain lines;
   a plurality of gate regions, each gate region being disposed above said substrate adjacent one of said plurality of drain lines, each of said plurality of gate regions including a floating gate;
   a plurality of inversion source gates, each said inversion source gate being disposed above said substrate adjacent to multiple ones of said plurality of gate regions, each of said plurality of inversion source gates inducing an inversion source line in said substrate upon application of a potential thereto, each said inversion source line defining a channel region in said substrate extending to an associated one of said plurality of drain lines, each of said defined channel regions being at least partially disposed under the floating gate of an associated gate region; and
   wherein during a read cycle said inversion source lines are established to pass charge from selected ones of said gate regions to their associated drain lines, and during a write cycle inversion source lines are removed to inject charge from selected inversion source gates into the floating gates of the associated gate regions.

19. The memory array of claim 18, wherein each of said gate regions and associated drain line and inversion source gate comprises a memory cell, and wherein each of said plurality of gate regions includes a program gate, a plurality of said program gates being electrically connected to form a block of memory cells.

20. The memory array of claim 19, wherein said array is divided into an even number of memory cell blocks and wherein memory cells in two different blocks of said memory array share drain lines.

21. The memory array of claim 19, wherein said array is divided into an even number of memory cell blocks and wherein memory cells in two different blocks of said memory array share inversion source gates.

22. The memory array of claim 18, wherein each of said plurality of drain lines includes an inversion drain gate disposed above said substrate, each of said inversion drain gates forming an inversion drain in said substrate with the application of a potential thereto.

23. A memory cell fabricated on a substrate, said memory cell comprising:
   a drain line;
   a gate region, said gate region being disposed above said substrate adjacent said drain line, said gate region including a floating gate;
   an inversion source gate, said inversion source gate being disposed above the substrate adjacent the gate region, said inversion source gate inducing an inversion source line in said substrate upon application of a potential thereto, said inversion source line defining a channel region in said substrate extending to said drain line, said defined channel region being partially disposed under the floating gate of said gate region; and wherein during a read cycle an inversion source line is established to pass charge from said gate region to said drain line, and during a write cycle an inversion source line is removed to inject charge from the inversion source gate into the floating gate of the gate region.

24. The memory cell of claim 23, wherein said drain line includes an inversion drain gate disposed above said substrate, said drain gate forming an inversion drain in said substrate with the application of a potential thereto.

* * * * *

UNITED STATES PATENT AND TRADEMARK OFFICE
CERTIFICATE OF CORRECTION

PATENT NO. : 5,291,439
DATED : Mar. 1, 1994
INVENTOR(S) : Kauffmann et al.

It is certified that error appears in the above-indentified patent and that said Letters Patent is hereby corrected as shown below:

Column 2, line 29, delete "bene" and substitute therefor --beneath--.

Column 5, line 21, delete "$C_{FN} > C_{NS}$" and substitute therefor --$C_{FN} \gg C_{NS}$--.

Column 10, line 21, between "pass" and "from" insert --charge--.

Column 11, lines 31 & 32 delete "insola-tion" and substitute therefor --isolation--.

Signed and Sealed this

Twelfth Day of July, 1994

Attest:

BRUCE LEHMAN

*Attesting Officer*   *Commissioner of Patents and Trademarks*